United States Patent
Ono et al.

(10) Patent No.: US 7,316,578 B2
(45) Date of Patent: Jan. 8, 2008

(54) ELECTRONIC DEVICE TEST APPARATUS WITH OPTICAL CABLES

(75) Inventors: Atsushi Ono, Tokyo (JP); Toshiyuki Okayasu, Tokyo (JP); Akihiro Fujimoto, Tokyo (JP); Masashi Shibata, Tokyo (JP)

(73) Assignee: Advantest Corporation, Tokyo (JP)

( * ) Notice: Subject to any disclaimer, the term of this patent is extended or adjusted under 35 U.S.C. 154(b) by 81 days.

(21) Appl. No.: 11/330,042

(22) Filed: Jan. 11, 2006

(65) Prior Publication Data

US 2006/0158204 A1    Jul. 20, 2006

Related U.S. Application Data

(63) Continuation of application No. PCT/JP2005/021690, filed on Nov. 25, 2005.

(30) Foreign Application Priority Data

Nov. 30, 2004 (JP) ............................. 2004-347860

(51) Int. Cl.
*H01R 29/00* (2006.01)
(52) U.S. Cl. .................. 439/172; 439/701; 385/59
(58) Field of Classification Search ............... 439/701, 439/172, 173; 385/59
See application file for complete search history.

(56) References Cited

U.S. PATENT DOCUMENTS 3,035,244 A * 5/1962 Aveni .......................... 439/629
6,095,695 A 8/2000 Ohtsuka et al.
6,139,341 A * 10/2000 Hun ............................ 439/172
6,157,200 A 12/2000 Okayasu
6,364,536 B1 * 4/2002 Chen et al. ................... 385/59
6,473,556 B1 10/2002 Takeuchi
6,480,390 B2 * 11/2002 Matsumiya et al. ........ 361/736
6,776,533 B2 * 8/2004 Gherardini ................... 385/59

FOREIGN PATENT DOCUMENTS

EP      1 172 673 A2     1/2002

* cited by examiner

*Primary Examiner*—Neil Abrams
(74) *Attorney, Agent, or Firm*—Osha Liang LLP

(57) ABSTRACT

The present invention provides a test apparatus which comprises: a test head which applies a test pattern to the electronic device; a main frame which includes multiple frame-side connectors and which supplies control signals to the test head via the frame-side connectors; and a cable unit which provides optical connection between the frame-side connectors and the test head, and which transmits the control signals to the test head. With such an arrangement, the cable unit comprises: multiple optical fiber cables which transmit the control signals; multiple unit-side connectors which are provided at the ends of the optical fiber cables, and which are provided corresponding to the multiple frame-side connectors; a unit fixing portion which fixes the cable unit to the main frame; and a connector holder which holds the unit-side connectors in a manner which enables each unit-side connector to be inserted/extracted into/from the frame-side connector independent of each other.

19 Claims, 11 Drawing Sheets

ELECTRONIC DEVICE TEST APPARATUS WITH OPTICAL CABLES

CROSS REFERENCE TO RELATED APPLICATION

This is a continuation application of PCT/JP2005/021690 filed on Nov. 25, 2005 which claims priority from a Japanese Patent Application No. 2004-347860 filed on Nov. 30, 2004, the contents of which are incorporated herein by reference.

BACKGROUND OF THE INVENTION

1. Field of the Invention

The present invention relates to a test apparatus for testing an electronic device. In particular, the present invention relates to a test apparatus which has a function of transmitting a signal using an optical fiber cable.

2. Related Art

As the speed of electronic devices has increased in recent years, there is a demand for development of a test apparatus having a function of testing an electronic device at high speed. Conceived examples of such high-speed operation test apparatuses include an apparatus having a configuration in which a main frame and a test head are connected via optical fiber cables. With such an arrangement, there is a need to connect the main frame and the test head using a great number of optical fiber cables.

Furthermore, with such an arrangement employing the optical fiber cables, there is a need to provide a connector at the end of each optical fiber cable. With such an arrangement, the main frame and the test head is connected by connecting each of the aforementioned connectors to a corresponding connector of the main frame.

For example, the main frame includes a great number of test boards. There is a need to provide multiple connectors for each test board.

As of now, no prior art documents have been recognized, and accordingly description of prior art documents will be abbreviated here.

Known examples of cable units for connecting such a great number of connectors include a cable unit having a function of connecting the connectors of multiple optical fiber cables to be connected, at the same time, for each test board. However, there is a problem of high risk of damaging the light emission face of each connector for connection with the optical fiber cable due to contact and so forth. In a case of performing connection of multiple connectors at the same time for each test board, in some cases, the light emission faces of a part of the connectors are damaged due to coming into contact with the test board or the like. As described above, in a case of connecting a main frame with a test head using optical fiber cables, conventionally-known connection methods have difficulty in efficiently and safely connecting the connectors of a great number of optical fibers.

SUMMARY OF THE INVENTION

Accordingly, it is an object of the present invention to provide a test apparatus which has a function for solving the aforementioned problems. This object is achieved by combining the features described in the independent claims in the Claims. Also, the dependent claims lay forth further advantageous specific examples of the present invention.

In order to solve the aforementioned problems, according to a first aspect of the present invention, a test apparatus which tests an electronic device comprises: a test head which applies test pattern signals to the electronic device; a main frame which includes multiple frame-side connectors and which supplies control signals to the test head via the frame-side connectors; and a cable unit which provides optical connection between the frame-side connectors and the test head, and which transmits the control signals to the test head. Furthermore, the cable unit comprises: multiple optical fiber cables which transmit the control signals; multiple unit-side connectors which are provided at the ends of the optical fiber cables, and which are provided corresponding to the multiple frame-side connectors; a unit fixing portion which fixes the cable unit to the main frame; and a connector holder which holds the unit-side connectors in a manner which enables each unit-side connector to be inserted/extracted into/from the frame-side connector independent of each other.

The connector holder may hold each of the unit-side connectors in a manner which allows movement of the unit-side connectors in the connection direction independent of each other.

The connector holder may include a retaining portion which enables each of the unit-side connectors to be retained even if each of the unit-side connectors is not connected to the frame-side connector.

The multiple frame-side connectors may be provided to a test board inserted into the main frame. The retaining portion may retain the multiple unit-side connectors at positions so as to not come in contact with the test board after the unit fixing portion has fixed the cable unit.

The multiple unit-side connectors may be provided on the face of the cable unit, in parallel with the connector-array direction which is approximately perpendicular to the connection direction of the frame-side connectors. Each of the unit-side connectors may include a retaining tab protruding in the unit-layered direction which is approximately perpendicular to both the connection direction and the connector-array direction. The connector holder may further comprise a holder base which has through grooves to which the retaining tabs of the corresponding unit-side connectors are to be inserted, and which holds the unit-side connectors in a manner which enables the unit-side connectors to be moved in the connection direction by holding the retaining tabs movably in the connection direction with each retaining tab being inserted into the corresponding through grooves.

The multiple through grooves may be formed at approximately the same pitch as the width of the unit-side connector in the connector-array direction.

The retaining tab may include a rear-side tab and a front-side tab provided at a position closer to the test board than the rear-side tab. The retaining portion may comprise a retaining plate which is detachably provided to the holder base, and which is fit to the front-side tabs of the multiple unit-side connectors. The rear-side tab of each of the unit-side connectors may be fit to the rear end of the through groove, with the front-side tab of each of the unit-side connectors being fit to the retaining plate, thereby retaining the multiple unit-side connectors at positions so as to not come in contact with the test head.

The retaining portion may include means for detachably fixing the retaining plate at a position where the retaining plate is fit to the front-side tab of each of the unit-side connectors in a case in which the rear-side tab of each of the unit-side connectors is fit to the rear end of the through groove.

The retaining portion may further include means for detachably fixing the retaining plate at a position where the retaining plate is fit to the rear-side tab of each of the unit-side connectors in a case in which the front-side tab of each of the unit-side connectors is fit to the front end of the through groove.

The retaining portion may further include means for detachably fixing the retaining plate at a position where the retaining plate comes in contact with neither the front-side tab nor the rear-side tab.

Each of the unit-side connectors may further include a return prevention protrusion which has elasticity, and which protrudes in the unit-layered direction, and which is provided at a position where the return prevention protrusion comes in contact with the front end of the through groove in a case in which the rear-side tab is fit to the rear end of the through groove.

Each of the unit-side connectors may further include a handle portion which protrudes in the unit-layered direction, and which is provided at a position where the handle portion is exposed outside of the holder base in a case in which the rear-side tab is fit to the rear end of the through groove. The cable unit may include multiple connector blocks each of which has multiple the unit-side connectors. The retaining portion may include the retaining plate and means for detachably fixing the retaining plate for each connector block.

The holder base may include openings each of which is provided between the adjacent connector blocks. The test board may include extending portions provided at positions corresponding to the openings. The fixing portion may fix the holder base and the extending portions with each of the extending portions being inserted into the corresponding opening.

The holder base may comprise: an upper-side base which has a front face with the unit-layered direction as the direction of the normal vector thereof, and which includes the through grooves provided on the front face; and a lower-side base which has a front face with the unit-layered direction as the direction of the normal vector thereof, and which is provided at a predetermined interval with respect to the upper-side base. With such an arrangement, the multiple unit-side connectors may be inserted between the upper-side base and the lower-side base.

The lower-side base may comprise: a cable passage portion where each of the optical fiber cables passes therethrough; and a cable outlet which is provided at the end of the cable passage portion, and which has an opening for inserting the optical fiber cables extending outside of the connector holder. With such an arrangement, the front face of the upper-side base where the through grooves are provided may include multiple through holes in a region facing the cable passage portion.

The cable unit may include multiple connector blocks each of which has multiple the unit-side connectors. With such an arrangement, the front face of the upper-side base facing the cable passage portion where the optical fiber cables connected to the connector block positioned closest to the cable outlet pass therethrough may be notched.

The interval between the upper-side base and the lower-side base in the region corresponding to the cable passage portion may be greater than the interval of the upper-side base and the lower-side base in the region corresponding to the through grooves. The cable passage portion may include a side face extending from the front face with the unit-layered direction of the lower-side base as the direction of the normal vector thereof, toward the upper-side base. The retaining portion may include means for detachably fixing the retaining plate to the side face.

The upper-side base may comprise: an upper-side main base including the multiple through grooves; and an upper-side sub-base which includes the multiple through holes, and which is detachably fixed to the upper-side main base in the region facing the cable passage portion.

According to a second aspect of the present invention, a test apparatus which tests an electronic device comprises: a first test head and a second test head each of which applies a test pattern to the electronic device; a main frame which includes a test board on the front face and the rear face thereof, each of which includes multiple frame-side connectors, with control signals being supplied to the first test head via the frame-side connectors provided on the front face, and with control signals being supplied to the second test head via the frame-side connectors provided on the rear face; a first cable unit which provides optical connection between the frame-side connectors provided to the front face of the test board and the first test head, and which transmits the control signals to the first test head; and a second cable unit which provides optical connection between the frame-side connectors provided to the rear face of the test board and the second test head, and which transmits the control signals to the second test head. Each of the first cable unit and the second cable unit comprises: multiple optical fiber cables which transmit the control signals; multiple unit-side connectors each of which is provided to the end of the optical fiber cable, and which are provided corresponding to the multiple frame-side connectors; and a connector holder which holds the unit-side connectors in a manner which enables each of the unit-side connectors to be inserted/ extracted into/from the corresponding one of the frame-side connectors independent of each other. The first cable unit further includes a first unit fixing portion which fixes the cable unit to the test board. The second cable unit further includes a second unit fixing portion which fixes the second cable unit to the first cable unit.

Note that the above outline of the invention is not a comprehensive list of all necessary features of the present invention, and that sub-combinations of these feature groups may also be inventions.

The present invention enables a great number of connectors of optical fiber cables to be efficiently and safely connected.

DETAILED DESCRIPTION OF THE INVENTION

The present invention will now be described by way of embodiments; however, it should be understood that the following embodiments do not restrict the invention according to the Claims, and that combinations of features described in the embodiments are not necessarily indispensable to the present invention.

Figure 1:
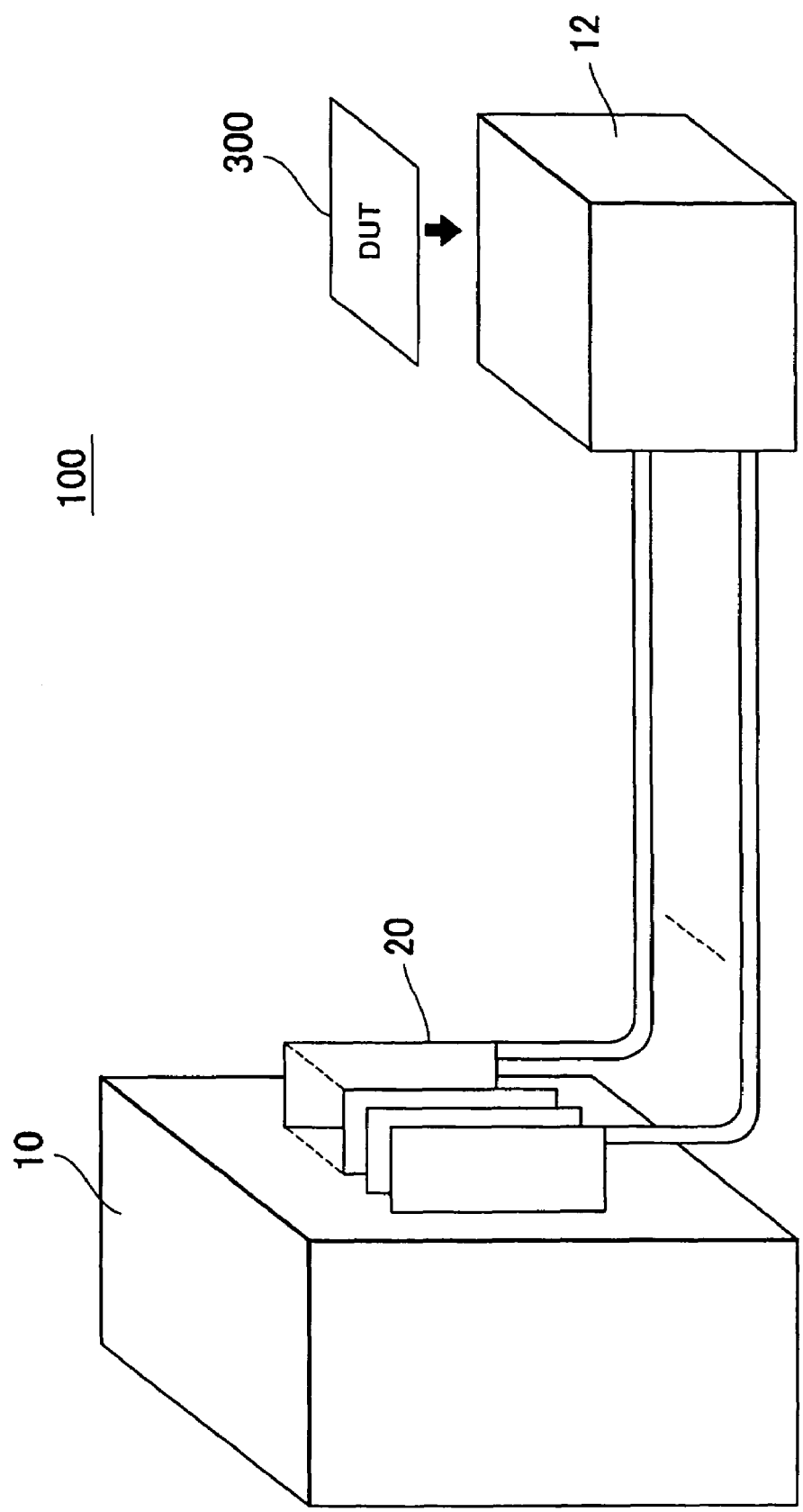
FIG. 1 is a diagram which shows an example of a configuration of a test apparatus according to an embodiment of the present invention.

FIG. 1 is a diagram which shows an example of a test apparatus 100 according to an embodiment of the present invention. The test apparatus 100 is an apparatus for testing an electronic device 300 such as a semiconductor circuit and so forth, and includes a main frame 10, multiple cable units 20, and a test head 12. With the present example, transmission of signals between the main frame 10 and the test head 12 is performed via optical fiber cables.

The test head 12 has a function of applying a test pattern to the electronic device 300. The test head 12 may apply test patterns to multiple electronic devices 300. Specifically, the test head 12 is connected to the main frame 10 via the cable unit 20. The test head 12 applies a test pattern to the electronic device 300 according to a control signal received from the main frame 10.

The main frame 10 has a function of creating a control signal, and supplying the control signal to the test head 12. The main frame 10 includes multiple test boards 14 described later with reference to FIG. 2. Each test board 14 creates a control signal corresponding to its own functions. Furthermore, each test board 14 includes multiple frame-side connectors. Each test board 14 can be connected to the corresponding cable unit 20 via the frame-side connectors. Each frame-side connector is a connector for an optical fiber cable.

The multiple cable units 20 are provided corresponding to the multiple test boards 14. With each cable unit 20, one end thereof is connected to the frame-side connector of the corresponding test board 14. The other end thereof is connected to the test head 12. That is to say, each cable unit 20 provides optical connection between the frame-side connector and the test head 12. This enables a control signal to be transmitted to the test head 12.

Figure 2:
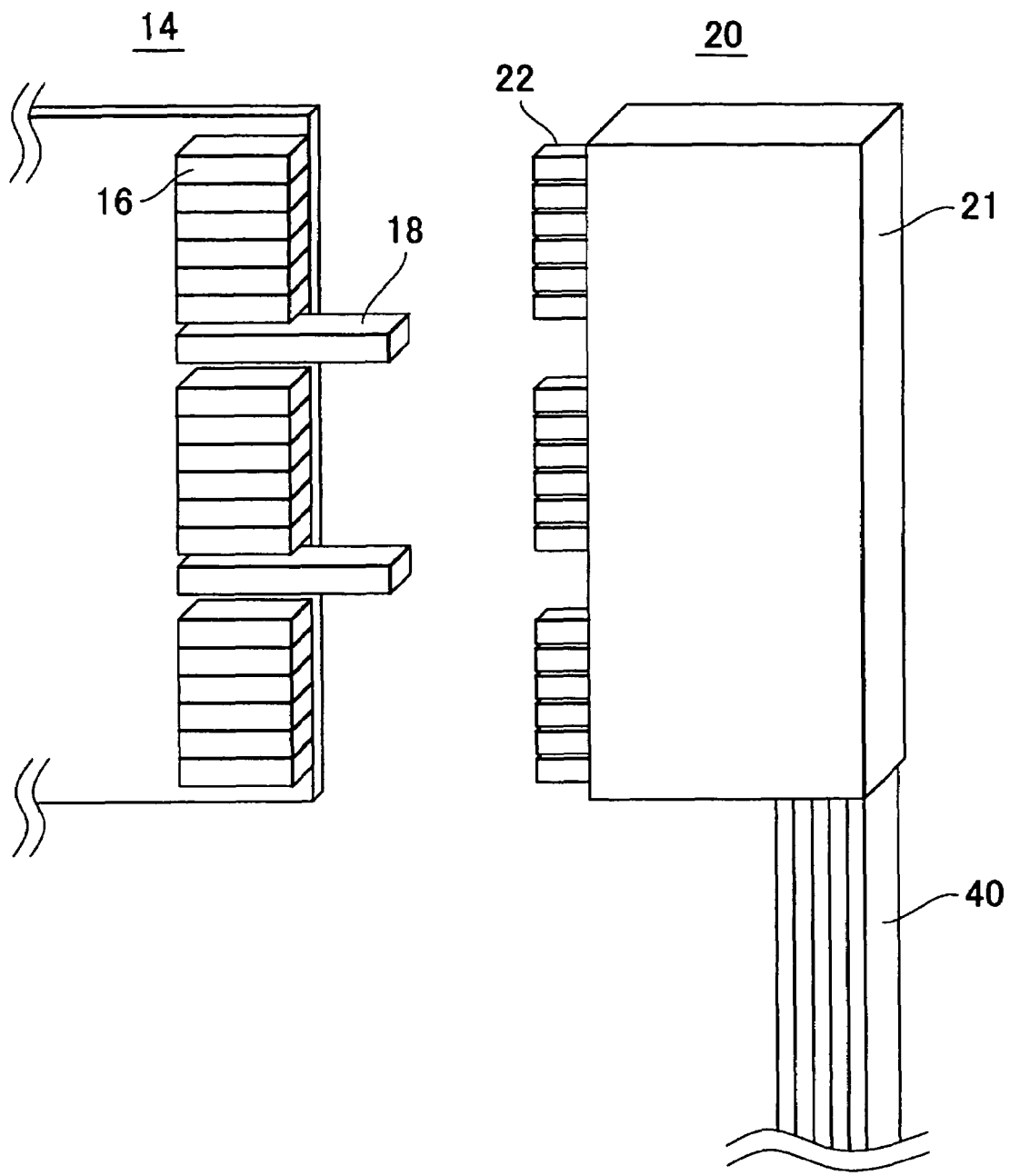
FIG. 2 is a schematic diagram which shows a test board 14 and a cable unit 20.

FIG. 2 is a schematic diagram which shows the test board 14 and the cable unit 20. The test board 14 is inserted to the main frame 10 described with reference to FIG. 1, with one end being exposed therefrom. Furthermore, the test board 14 includes multiple frame-side connectors 16 and extending portions 18 at the end exposed from the main frame 10. The multiple frame-side connectors 16 are provided in the form of an array in parallel with the direction approximately perpendicular to the connecting direction of the cable unit 20. Furthermore, the multiple frame-side connectors 16 are partitioned into multiple blocks. The extending portion 18 is provided between the adjacent blocks. The multiple frame-side connectors 16 and the extending portions 18 are fixed on the face of the test board 14.

The cable unit 20 includes multiple optical fiber cables 40, multiple unit-side connectors 22, and a connector holder 21. With regard to the optical fiber cable 40, one end thereof is connected to the unit-side connector 22, and the other end thereof is connected to the test head 12. This enables a control signal to be transmitted from the main frame 10 to the test head 12.

The multiple unit-side connectors 22 are provided corresponding to and parallel with the multiple frame-side connectors 16. Furthermore, the connector holder 21 holds the unit-side connectors 22 corresponding to the frame-side connectors 16 in a manner which enables each unit-side connector 22 to be inserted and extracted independent of each other.

Furthermore, the multiple unit-side connector 22 is partitioned into multiple blocks in the same way as with the frame-side connectors 16. Furthermore, an insertion hole is provided between each pair of the adjacent blocks, which allows the insertion of the extending portion 18. The cable unit 20 is fixed to the corresponding test board 14 by inserting each extending portion 18 to the corresponding insertion hole.

As described above, the connector holder 21 holds the multiple unit-side connectors 22 at all the same time. The cable unit 20 is fixed at a predetermined position on the corresponding test board 14 by actions of a fixing portion 28 described later. Such an arrangement allows all the unit-side connectors 22 to be easily set to a position where the unit-side connectors 22 can be inserted into the frame-side connectors 16. Furthermore, the connector holder 21 holds the unit-side connectors 22 in a manner which enables each unit-side connector 22 to be inserted and extracted independent of each other. Such an arrangement enables each unit-side connector 22 to be inserted into the corresponding frame-side connector 16 with high precision. This enables damage of the light emission face of each unit-side connector 22 to be suppressed.

Figure 3:
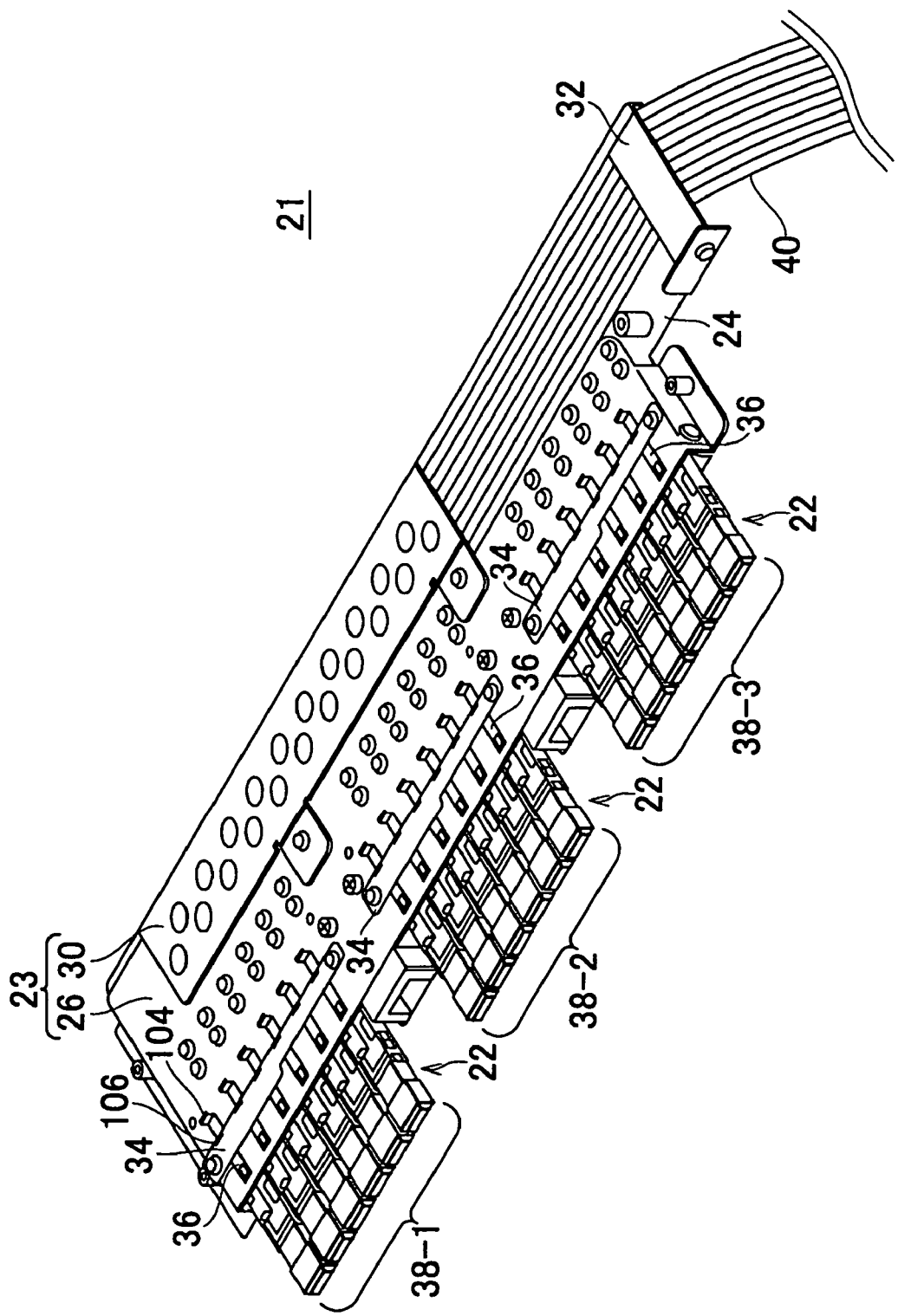
FIG. 3 is a diagram which shows an example of a configuration of a connector holder 21.

FIG. 3 is a diagram which shows an example of a configuration of the connector holder 21. The connector holder 21 includes an upper-side base 23, lower-side base 24, and a unit fixing portion 28. Note that the terms "upper-side" and "lower-side" are used only for distinction of these bases. They are not intended to indicate the position relation therebetween in actual usage.

The multiple unit-side connectors 22 are provided to the ends of the optical fiber cables 40. The multiple unit-side connectors 22 are provided corresponding to the multiple frame-side connectors 16 described above with reference to FIG. 2. Specifically, the multiple unit-side connectors 22 are provided on the face of the cable unit in parallel with the connector array direction approximately perpendicular to the connection direction. Furthermore, the multiple unit-side connectors 22 are partitioned into multiple connector blocks 38-1 through 38-3 (which will collectively be referred to as "connector blocks 38" hereafter). Also, each of the frame-side connectors 16 and the unit-side connectors 22 may be a so-called MPO connector.

Furthermore, the upper-side base 23 and the lower-side base 24 are provided with a certain space introduced therebetween. The multiple unit-side connectors 22 are inserted in parallel into the space between the upper-side base 23 and the lower-side base 24. There is a need to provide the upper-side base 23 and the lower-side 24 with a greater space introduced therebetween than the thickness of the unit-side connectors 22. With such an arrangement, the space is preferably provided with generally the same size as the thickness of the unit-side connectors 22. Such a structure enables the upper-side base 23 and the lower-side base 24 to function as holder bases for holding the multiple unit-side connectors 22.

As described above with reference to FIG. 2, the holder bases (23, 24) hold the unit-side connectors 22 corresponding to the frame-side connectors in a manner which enables each unit-side connector 22 to be inserted and extracted independent of each other. That is to say, the holder bases (23, 24) hold the unit-side connectors 22 in a manner which enables each unit-side connector 22 to be moved independent of each other in the connection direction for the frame-side connector 16.

Furthermore, the lower-side base 24 includes a cable outlet 32 having an opening for inserting the optical fiber cables 40 extending outside of the connector holder 21.

With such an arrangement, the upper-side base 23 includes an upper-side main base 26 and an upper-side sub-base 30. The upper-side sub-base 30 is detachably fixed to the upper-side main base 26. For example, the upper-side base 30 is fixed at a predetermined position on the upper-side main base 26 with screws or the like.

The upper-side main base 26 includes multiple through grooves 36 at positions corresponding to the multiple unit-side connectors 22. Retaining tabs (104, 106) provided to each unit-side connector 22 are inserted into the corresponding through groove 36 so as to pass therethrough.

Each unit-side connector 22 includes the retaining tabs (104, 106) protruding in the unit-layered direction perpendicular to both the connection direction and the connector-array direction.

The holder bases (23, 24) hold the retaining tabs (104, 106) of each unit-side connector 26 with the retaining tabs (104, 106) of the unit-side connector 22 being inserted into the corresponding through groove 36 so as to pass therethrough in a manner which enables the retaining tabs to be moved along the through groove 36 in the connection direction.

This enables each unit-side connector 22 to be held in a manner which enables it to be moved in the connection direction. For example, each through groove 36 is formed with approximately the same width as that of the retaining tabs (104, 106) to be inserted. Furthermore, each through groove 36 is provided along the connection direction, such that the inserted retaining tabs (104, 106) can be moved in the connection direction.

The unit fixing portion 28 has a function for fixing each cable unit 20 to the corresponding test board 14. With the present example, the unit fixing portion 28 is an insertion hole having an opening formed between the adjacent connector blocks 38 on the face facing the test board 14. The test board 14 has the extending portion 18 extending in the connection direction, at the position corresponding to the aforementioned opening. The position of the cable unit 20 is determined with respect to the test board 14 by inserting the extending portion 18 into the aforementioned insertion hole. Also, the unit fixing portion 18 may have means for fixing the extending portion 18, inserted into the insertion hole, to the lower-side base 24. For example, the lower-side base 24 may include a through hole formed at a position corresponding to the aforementioned insertion hole. With such an arrangement, the extending portion 18 may be fixed to the lower-side base 24 by inserting a screw or the like into the through hole. At the time of fixing each cable unit 20 to the test board 14 with the unit fixing portion 28 fixing the cable unit 20, each unit-side connector 22 is preferably retained at a position where the unit-side connector 22 does not come in contact with the test board 14. With the present example, each unit-side connector 22 is preferably retained at a position where a rear-side tab 104 of the retaining tabs being fit to the rear end of the through groove 36 as shown in FIG. 3. Such an arrangement in which each unit-side connector 22 is thus retained enables the cable unit 20 to be fixed while preventing damage of the light-emission face of each unit-side connector 22 due to coming into contact with the test board 14.

For example, the connector holder 21 includes a retaining portion which allows each unit-side connector 22 to be retained in a state in which the unit-side connectors 22 are not connected to the frame-side connectors 18, i.e., in a state in which each rear-side tab 104 is fit to the rear end of the corresponding through groove 36. With the present example, the retaining portion includes a retaining plate 34 which is detachably mounted on the upper-side main base 26, and means for fixing the retaining plate 34 at a predetermined position on the upper-side main base 26, for each connector block 38.

In a case that each unit-side connector 22 is retained with the rear-side tab 104 being fit to the rear end of the through groove 36, the retaining plate 34 approximately perpendicularly intersects each of the multiple parallel through grooves 36.

Then, after fixing the cable unit 20 to the test board 14, each retaining plate 34 is removed from the upper-side main base 26. This allows each unit-side connector 22 to be moved in the connection direction. Then, each unit-side connector 22 is connected to the corresponding frame-side connector 16 in order. Such a configuration provides efficient and safe connection of a great number of connectors of the optical fiber cables.

Figure 4:
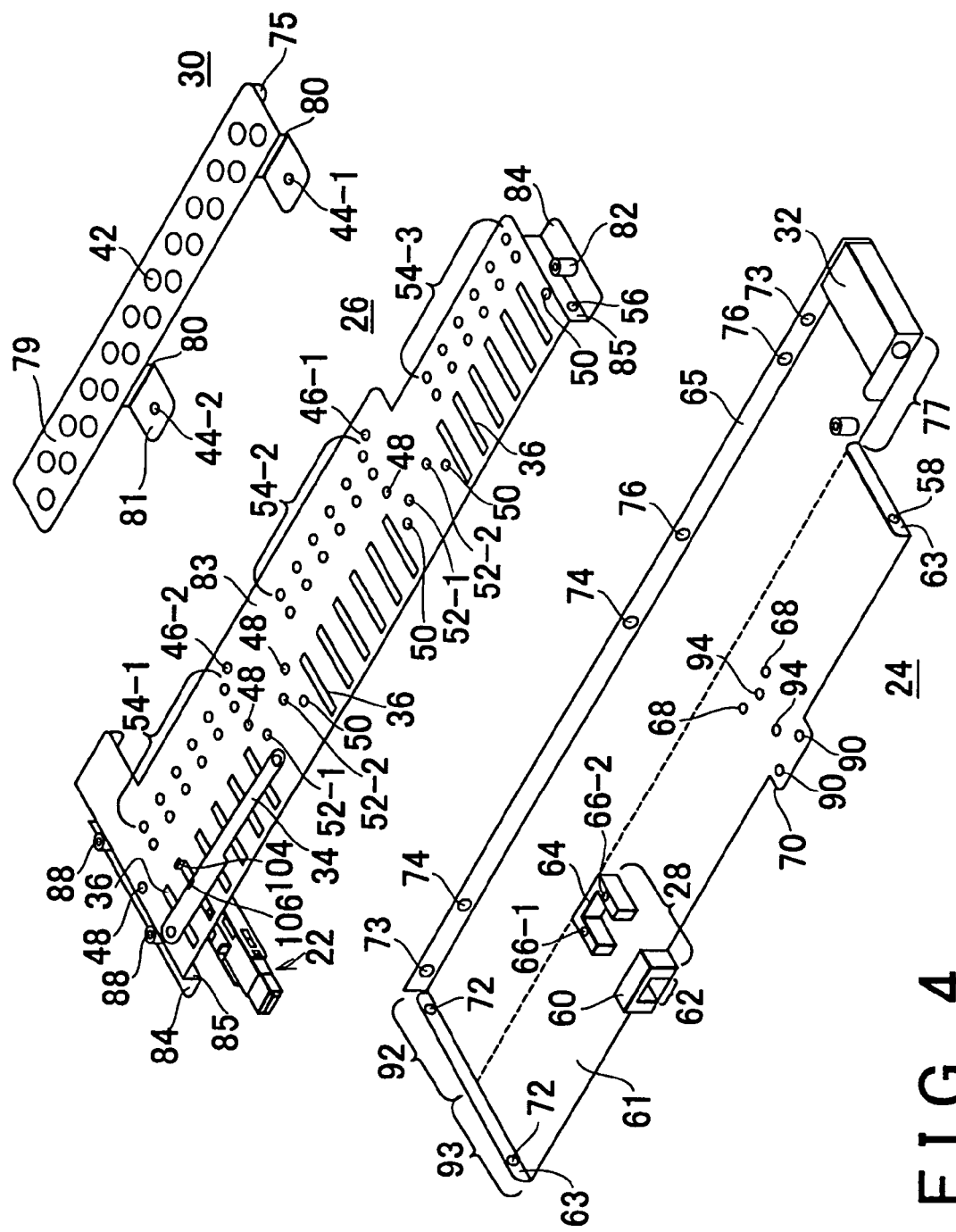
FIG. 4 is a diagram which shows the exterior of an upper-side base 26, upper-side sub-base 30, and lower-side base 24.

FIG. 4 is a diagram which shows an example of the exterior of the upper-side main base 26, the upper-side sub-base 30, and the lower-side base 24.

First, description will be made regarding the lower-side base 24. The lower-side base 24 includes a bottom face 61 approximately parallel with the front face of the upper-side main base 26, two side faces 63, which extend from the bottom face 61 toward the upper-side main base 26 and are approximately parallel with the connection direction, a cable passage-portion side face 65 which extends from the bottom face 61 toward the upper-side main base 26 and which has the normal vector in the connection direction. Note that no side face is provided on the side of the bottom face 61 where the unit-side connectors 22 are to be arranged. Furthermore, the bottom face 61 has a protruding face 70 protruding in the connection direction from the side thereof where the unit-side connectors 22 are to be arranged.

The bottom face 61 has a connector region 93 where the unit-side connectors 22 are to be inserted and arranged, and a cable passage region 92 where the optical-fiber cables 40 connected to the unit-side connectors 22 pass therethrough. The connector region 93 includes the unit fixing portion 28. The unit-fixing portion 28 includes an opening member 60 provided to the protruding face 70, and a stopper 64. The opening member 60 and the protruding face 70 form a through hole 62 having an opening on the face facing the test board 14. Furthermore, the stopper 64 is provided at a predetermined distance from the opening member 60 in the connection direction. The stopper 64 is provided in the form protruding in the normal direction of the bottom face 61.

Furthermore, the stopper 64 has screw holes 66-1 and 66-2 (which will collectively be referred to as "screw holes 66" hereafter).

At the time of connecting the cable unit 20 to the test board 14, each extending portion 18 of the test board 14 is inserted into the through hole 62 of the opening member 60 at a depth where the end of the extending portion 18 comes in contact with the stopper 64.

Furthermore, the bottom face 61 includes screw openings 68 which allows the stopper 64 to be fixed. The stopper 64 is fixed at a position corresponding to the screw openings 68 with screws. Furthermore, the protruding face 70 includes screw openings 90. The opening member 60 is fixed at a position corresponding to the screw openings 90 with screws. Furthermore, the bottom face 61 includes screw openings 94 between the region where the screw openings 68 are provided and the region where the screw openings 90 are provided. The extending portion 18 is fixed to the bottom face 61 through the screw openings 94 with the extending portion 18 being in contact with the stopper 64. Such a configuration allows the cable unit 20 to be fixed at a predetermined position on the test board 14. While FIG. 4 shows an arrangement including only a single unit fixing portion 28, the lower-side base 24 includes multiple unit fixing portions 28 as shown in FIG. 3.

The side faces 63 include screw openings (58, 72) for fixing the lower-side base 24 to the upper-side main base 26. Each side face 63 has a greater height than that of the unit-side connectors 22. The cable-passage-portion side face 65 includes screw openings (73, 74, 75). The screw openings 74 are provided for fixing the lower-side base 24 to the upper-side sub-base 30 with screws. The screw openings 73 are provided for fixing the cable unit 20 to another cable unit 20 with screws. Description will be made later with reference to FIG. 10, regarding a structure which enables the cable units 20 to be fixed to each other with screws. The screw openings 76 is provided for inserting the unit-side connectors 22 to the frame-side connectors 16, where the retaining plate 34 is removed from the position as shown in FIG. 3, and is fixed at a retracted position using the screw openings 76.

On the other hand, the cable passage region 92 and the cable-passage-portion side face 65 function as a cable passage portion which allows the optical fiber cables 40, connected to the unit-side connectors 22, to pass therethrough. The bottom face 61 has a protruding face 77 in the cable passage region 92, which protrudes in the connector-array direction as to the connector region 93 thereof.

The protruding face 77 includes the cable outlet 32 at the end thereof, which has an opening for inserting the optical fiber cables 40 through the cable passage portion.

Next, description will be made regarding the upper-side main base 26. The upper-side main base 26 has a front face 83 facing the bottom face of the lower-side base 24, two side faces 85 which protrude from the front face 83 toward the lower-side base 24, and which extend approximately in parallel with the connection direction, and connection faces 84 each of which protrudes outwards from the corresponding side face 85 and which extend approximately in parallel with the front face 83.

The front face 83 includes multiple through grooves 36 described above with reference to FIG. 3. The multiple through grooves 36 are provided for each connector block 38 in parallel with the connector-array direction of the unit-side connectors 22. The through grooves 36 are preferably formed for each block at approximately the same pitch as the width of each unit-side connector 22 along the connector-array direction. This prevent the unit-side connectors 22 from swinging in the connector-array direction. With the present example, description has been made regarding an arrangement in which the bottom face 61 has no side face on the side where the unit-side connectors 22 are to be arranged. Also, an arrangement may be made in which the bottom face 61 includes partitions or the like on the aforementioned side face for determining the position of each unit-side connector 22 in the connector-array direction.

Furthermore, the aforementioned retaining portion includes the retaining plate 34 and the means for detachably fixing the retaining plate 34, for each block of the through grooves 36.

As the aforementioned means for fixing the retaining plate 34, with the present example, screw openings 50 are provided, which allows the retaining plate 34 to be fixed to the front face 83 with screws. A pair of the aforementioned screw openings is provided for each block of the through holes 36. These pairs of the screw openings 50 are provided so as to form a line approximately perpendicular to each through groove 36. With the retaining portion, the retaining plate 34 is fixed by fixing both ends of the retaining plate 34 through the screw openings 50 with screws. While FIG. 4 shows an arrangement in which the retaining plate 34 is fixed for only a single block of the multiple blocks, the retaining plates 34 are also fixed to the other blocks in the same way. This enables each of the unit-side connectors 22 to be held at approximately the same position in the connection direction. While FIG. 4 shows an arrangement in which the unit-side connector 22 is inserted into only one of the through grooves 36, the unit-side connectors 22 are also inserted into the other through grooves 36 in the same way as shown in FIG. 3.

With such an arrangement, each screw opening 50 is provided such that the retaining plate 34 is fit to the front-side tab 106 of each unit-side connector 22 in the state in which the rear-side tab 104 of each unit-side connector 22 is fit to the rear end of the corresponding through groove 36. That is to say, the screw openings 50 are formed such that the distance between the rear end of each through groove 36 and the end of the retaining plate 34 facing the aforementioned rear end is the same as the distance between the rear-side tab 104 and the front-side tab 106 of each unit-side connector 22 in the state in which the retaining plate 34 is fixed through the screw openings 50.

Furthermore, the retaining portion preferably further includes means for detachably fixing the retaining plate 34 in a region different from the region where the multiple through grooves 36 are provided when inserting the unit-side connectors 22 into the frame-side connectors 16, such that the retaining plate 34 is in contact with neither the front-side tab 106 nor the rear-side tab 104.

That is to say, the retaining portion further includes means for fixing the retaining plate 34 at a retracted position. With the present example, the front face 83 includes screw openings 48 for fixing the retaining plate 34 to the front face 83 with screws, as the aforementioned means for fixing the retaining plate 34 at a retracted position. A pair of the aforementioned screw openings 48 is provided for each block of the through grooves 36.

With such an arrangement, each of the screw openings 48 is provided at a position which does not overlay or overlap with any through groove 36 in the state in which the retaining plate 34 is fixed through the screw openings 48. With the present example, each of these screw openings 48 is provided between the through grooves 36 and screw openings 54.

Furthermore, the front face 83 includes screw openings 54-1, 54-2, and 54-3 (which will collectively be referred to as "screw openings 54" hereafter) for fixing cable guides provided corresponding to the unit-side connectors 22. Each of the screw openings is provided corresponding to the through grooves 36. Each of the screw openings 54 is preferably provided at a distance from the corresponding through groove 36, proportional to the distance between the through groove 36 and the cable outlet 32. The cable guides are provided between the upper-side main base 26 and the lower-side base 24 through the screw openings 54. Each cable guide flexes the optical fiber cable 40 so as to pass through the cable passage portion of the lower-side base 24. With such an arrangement, the distance between each screw opening 54 and the corresponding through groove 36 is determined so as to be proportional to the distance between the through groove 36 and the cable outlet 32. This enables the optical fiber cables 40 to be flexed at different positions such that the optical fiber cables 40 are arranged in parallel with each other.

Furthermore, each cable guide has a curved face with a predetermined curvature. The optical fiber cables 40 are introduced to the cable passage region 92 from the ends of the unit-side connectors 22 along the aforementioned curved faces. Such a structure enables each optical fiber cable 40 to be introduced with a limited curvature. Furthermore, the curved face of each cable guide has a certain elasticity. With such an arrangement, the curved face preferably has an elasticity which prevents the curved face from flexing with a predetermined curvature or more following the movement of the optical fiber cables 40 at the time of inserting or extracting the unit-side connectors 22.

This maintains each optical fiber cable 40 with the predetermined curvature. Furthermore, this suppresses deformation of the curved face with a small curvature even if the optical fiber cables 40 are flexed. Such an arrangement prevents the interference of the cable guide with the optical fiber cables 40 introduced by the adjacent cable guide.

On the other hand, in some cases, there is an insufficient area for providing the screw openings 48 due to a small distance between the screw openings 54 and the block of the through grooves 36 provided at positions closest to the cable outlet 32. With such an arrangement, the retaining plate 34 corresponding to the block of the through grooves 36 provided at positions closest to the cable outlet 32 is retract to a position corresponding to the aforementioned screw openings 76 formed on the lower-side base 24, as described above. That is to say, the screw openings 48 and the screw openings 76 function as means for detachably fixing the retaining plates 34 at regions where the retaining plates 34 do not come in contact with both the front-side tab 106 and the rear-side tab 104, which is different from the regions where the multiple through grooves 36 are provided, at the time of the insertion of the unit-side connectors 22 into the frame-side connectors 16.

Furthermore, the front face 83 includes screw openings 52-1 and 52-2 (which will collectively be referred to as "screw openings 52" hereafter) at positions corresponding to the screw openings 66 for the stopper 64. This allows each stopper 64 to be fixed to the front face 83 with screws. On the other hand, each side face 85 includes a screw opening 56 at a position corresponding to the screw opening 58 provided to the side face 63 of the lower-side base 24. This enables each side face 63 of the lower-side base 24 to be fixed to the corresponding side face 85 of the upper-side base 26 with screws. On the other hand, the connection faces 84 include screw openings (82, 88) for fixing the cable unit 20 to another cable unit 20 with screws. Description will be made later with reference to FIG. 10, regarding a structure which enables these cable units 20 to be fixed to each other with screws.

On the other hand, the region of the front face 83 including the block of the through grooves 36 positioned closest to the cable outlet 32 is formed with a smaller width than the width of the regions including the other through grooves 36.

With such an arrangement, the front face 83 of the upper-side main base 26 is provided such that the cable passage region 92 of the lower-side base 24 is exposed. That is to say, the front face 83 of the upper-side main base 26 is provided such that it does not cover the cable passage region 92. Furthermore, the front face 83 includes screw openings 46-1 and 40-2 (which will collectively be referred to as "screw openings 46" hereafter) at the end on the side of the cable passage region 92, for fixing the upper-side main base 26 to the upper-side sub-base 30.

Next, description will be made regarding the upper-side sub-base 30. The upper-side sub-base 30 includes: a front face 79 facing the cable passage region 92 of the lower-side base 24; a side face 75 which protrudes from the front face 79 and which is to be fixed to the cable passage-portion side face 65 of the lower-side base 24; side faces 80 protruding from the front face 79, approximately in parallel with the side face 75; and connection faces 81 each of which protrudes outward from the corresponding side face 80, approximately in parallel with the front face 79.

The connection faces 81 include screw openings 44-1 and 44-2 (which will collectively be referred to as "screw openings 44" hereafter). The upper-side sub-base 30 is fixed on the front face of the upper-side main base 26 through the screw openings 44 and the screw openings 46 formed on the upper-side main base 26 with screws. The front face 79 is provided at a position so as to cover the cable passage region 92 of the lower-side base 24. Furthermore, the front face 79 includes multiple through holes 42. Such a structure provides the through holes 42 in a region facing the cable passage portion. This allows the state of the optical fiber cables 40, which pass through the cable passage portion, to be monitored.

With such an arrangement, the front face 79 of the upper-side sub-base 30 is provided at a position higher than the front face 83 of the upper-side main base 26 by a height of the side faces 80. With such an arrangement, the interval of upper-side base 23 and the lower-side base 24 in the region corresponding to the cable passage portion is greater than the interval therebetween in the region where the through grooves 36 are provided. Such a structure provides the increased cross-sectional area of the cable passage portion. This facilitates the movement of the optical fiber cables 40 following the insertion and extraction of the unit-side connectors 22

On the other hand, the closer to the cable outlet 32, the greater the number of the optical fiber cables 40 passing through the cable passage portion is. With the present example, the front face of the upper-side base 23 is notched in a region corresponding to the region of the cable passage portion where the optical fiber cables 40 connected to the connector block 38 closest to the cable outlet 32 passes through. That is to say, the front face 79 of the upper-side base 23 is provided so as to cover the cable passage region 92 of the lower-side base 24, corresponding to the blocks of the through grooves 36 other than those closest to the cable outlet 32.

Such an arrangement facilitates the movement of the optical fiber cables 40 following the insertion and extraction of the unit-side connectors 22 as described above. Let us say that the number of the optical fiber cables 40, which passes through the cable passage portion, is small. In this case, an arrangement may be made in which the front face 79 of the upper-side base is provided so as to cover the entire cable passage region 92.

With such an arrangement, the upper-side sub-base 30 is detachably provided to the upper-side main base. This allows the upper-side sub-base 30 to be detached after assembly of the connector holder 21. This enables the positions of the optical fiber cables 40 to be easily adjusted.

Figure 5:
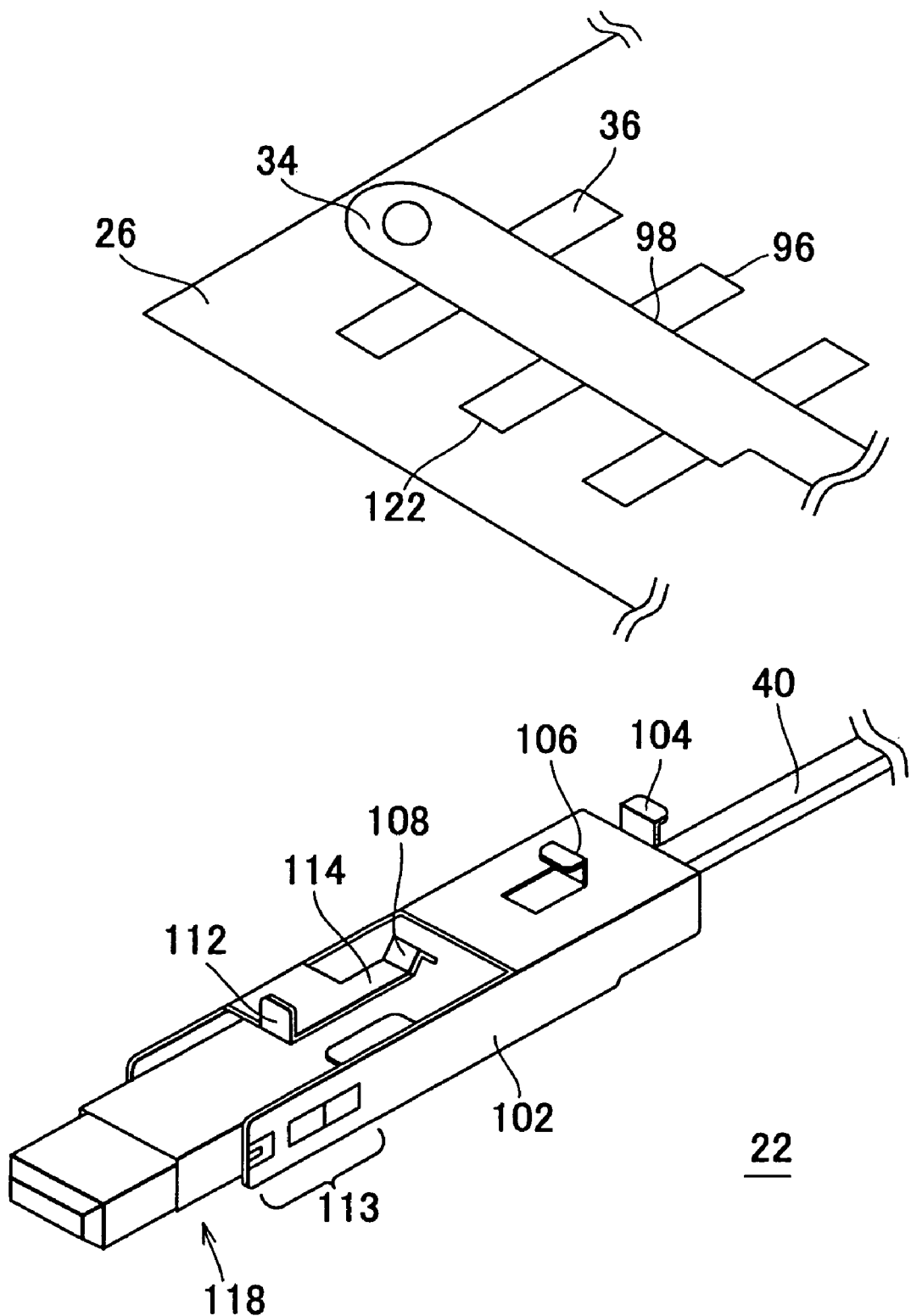
FIG. 5 is an enlarged diagram which shows an example of a unit-side connector 22 and through grooves 36.

FIG. 5 is an enlarged diagram which shows an example of the unit-side connector 22 and the through grooves 36. Each unit-side connector 22 includes a connector tip portion 118, and a sheath 102 provided so as to cover the outer face of the connector tip portion 118.

The connector tip portion 118 is provided at the tip of each optical fiber cable 40. The connector tip portion 118 is inserted into the frame-side connector 16. Furthermore, the connector tip portion 118 includes a cover for protecting the light emission face. At the time of inserting the connector tip portion 118 into the frame-side connector 16, the cover is removed therefrom.

The sheath 102 is formed of metal, for example. The sheath 102 includes the front-side tab 106, the rear-side tab 104, a fitting portion 113, a return prevention protrusion 108, an elastic portion 114, and a handle portion 112. The fitting portion 113 is fit to the connector tip portion 118. This fixes the sheath 102 to the connector tip portion 118. The rear-side tab 104 is provided so as to protrude toward the upper-side main base 26. Furthermore, the tip of the rear-side tab 104 is provided so as to protrude toward the rear end 96 of the through groove 36. On the other hand, the front-side tab 106 is provided so as to protrude toward the upper-side main base 26. Furthermore, the tip of the front-side tab 106 is provided so as to protrude toward the front end 122 of the through groove 36.

The return prevention protrusion 108 is provided at a position such that it comes in contact with the front end 122 of the through groove 36 upon fitting the rear-side tab 104 to the rear end 96 of the through groove 36. Furthermore, the return prevention protrusion 108 is provided so as to protrude toward the upper-side main base 26, i.e., in the unit-layered direction. With such an arrangement, the return prevention protrusion 108 is connected to the main body of the sheath 102 through the elastic portion 114. The elastic portion 114 turnably holds the return prevention portion 108 with respect to the unit-layered direction.

On the other hand, the handle portion 112 is provided being exposed outward from the upper-side main base 26 and the lower-side base 24 upon fitting the rear-side tab 104 to the rear end 96 of the through groove 36, and protruding in the unit-layered direction. The handle portion 112 allows the user to move the unit-side connector 22 in the connection direction.

Prior to the insertion of the unit-side connector 22 into the frame-side connector 16, the unit-side connector 22 is inserted up to the position where the rear-side tab 104 is fit to the rear end 96 of the through groove 36, such that at the retaining portion, the retaining plate 34 is retained at a position where the end 98 of the retaining plate 34 is fit to the front-side tab 106. Such an arrangement enables the cable unit 20 to be safely fixed to the test board 14 while retaining each unit-side connector 22 at a position where it does not come in contact with the test board 14.

At this time, the return prevention protrusion 108 comes in contact with the front end 122 of the through groove 36.

Then, in the stage for the insertion of the unit-side connectors 22 into the frame-side connectors 16, the retaining plates 34 are removed. This allows the movement of the unit-side connectors 22 in the connection direction. Note that in a state in which external force is not applied, each unit-side connector 22 is retained by actions of the rear-side tab 104 and the return prevention protrusion 108. On the other hand, each retaining plate 34 is retracted to the position corresponding to the screw openings 48 or the like, as described above. Subsequently, the user inserts the unit-side connectors 22 into the frame-side connectors 16 in order. Such an arrangement allows the user to safely insert each unit-side connector 22 into the corresponding frame-side connector 16.

Figure 6:
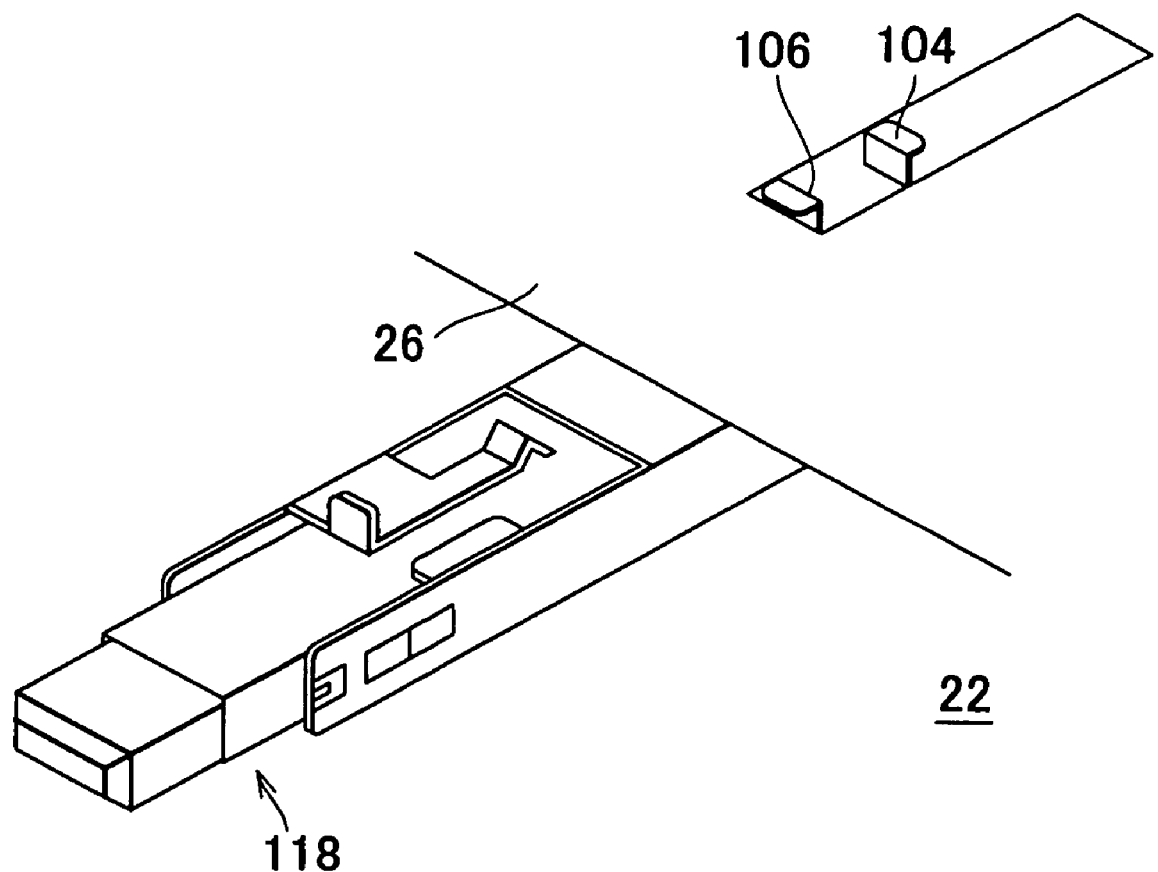
FIG. 6 shows the position of the unit-side connector 22 as to the through groove 36 after the insertion thereof into the frame-side connector 16.

FIG. 6 shows the position of the unit-side connector 22 with respect to the through groove 36 after the insertion thereof into the frame-side connector 16. Upon inserting the unit-side connector 22 into the frame-side connector 16, the front-side tab 106 of the unit-side connector 22 is fit to the front end 122 of the through groove 36.

Figure 7:
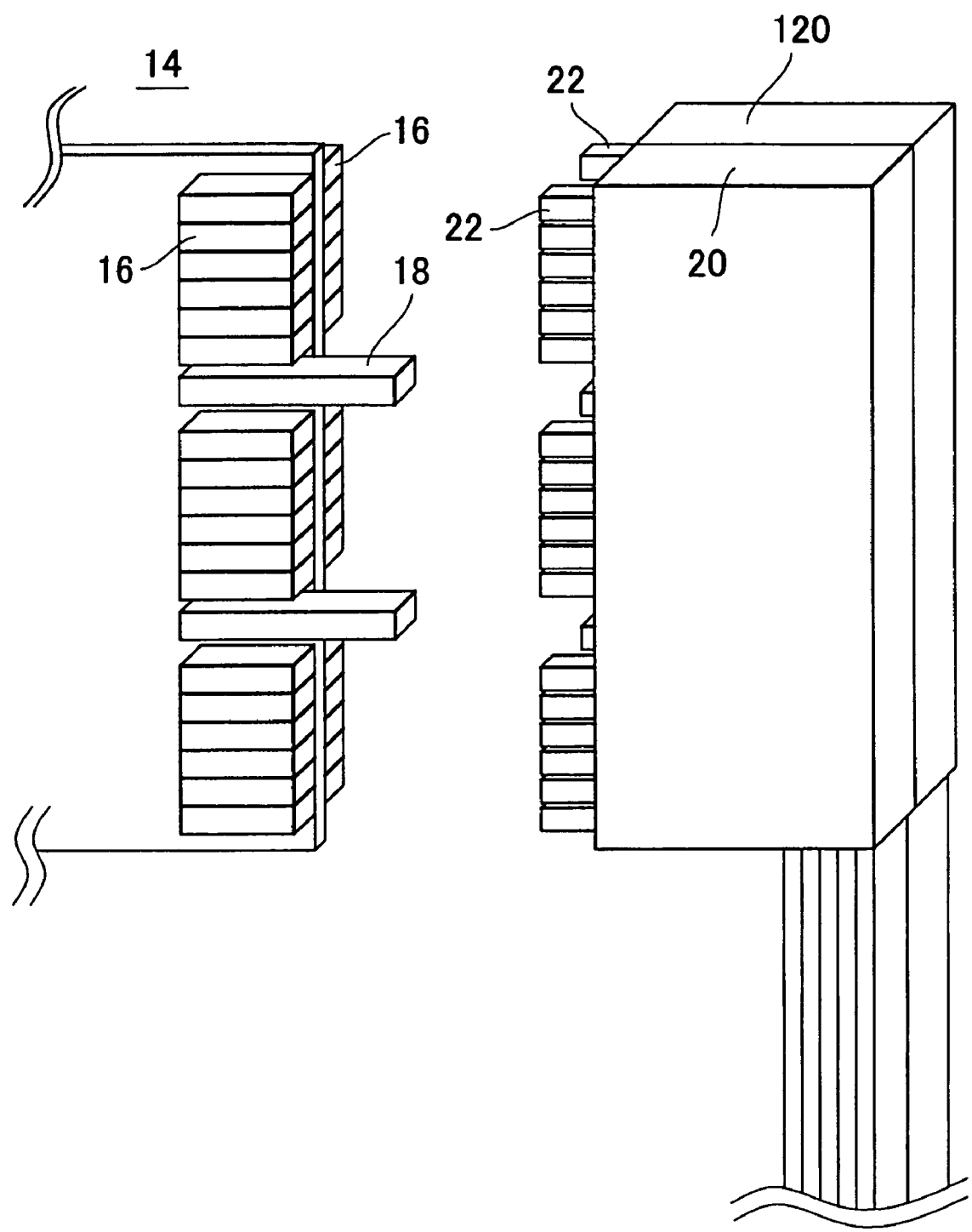
FIG. 7 is a schematic diagram which shows a test board 14 included in the test apparatus 100 including two test heads 12.

FIG. 7 is a schematic diagram which shows the test board 14 in the test apparatus 100 including two test heads 12. With such an arrangement including the two test heads 12, the test board 14 includes multiple frame-side connectors 16 on both the front face and the rear face thereof.

With such an arrangement, the main frame 10 supplies control signals to a first test head 12 through the frame-side connectors 16 provided on the front face of the test board 14. On the other hand, the main frame 10 supplies control signals to a second test head 12 through the frame-side connectors 16 provided on the rear face of the test board 14.

Furthermore, the test apparatus 100 includes: a first cable unit 20 which provides optical connection between the frame-side connectors 16 provided to the front face of the test board 14, for transmitting control signals to the first test head 12; and a second cable unit 120 which provides optical connection between the frame-side connectors 16 provided to the rear face of the test board 14, for transmitting control signals to the second test head 12

With such an arrangement, the test board 14 includes the extending portions 18 on the front face thereof, but includes no extending portion 18 on the rear face thereof. The first cable unit 20 has the same configuration as that of the cable unit 20 described above with reference to FIGS. 2 through 6. The first cable unit 20 is connected to the test board 14 through the extending portions 18. On the other hand, the difference between the second cable unit 120 and the first cable unit 20 is as follows. That is to say, the second cable unit 120 has no unit fixing portion 28. Furthermore, the second cable unit 120 includes means for fixation to the first cable unit 20.

Figure 8:
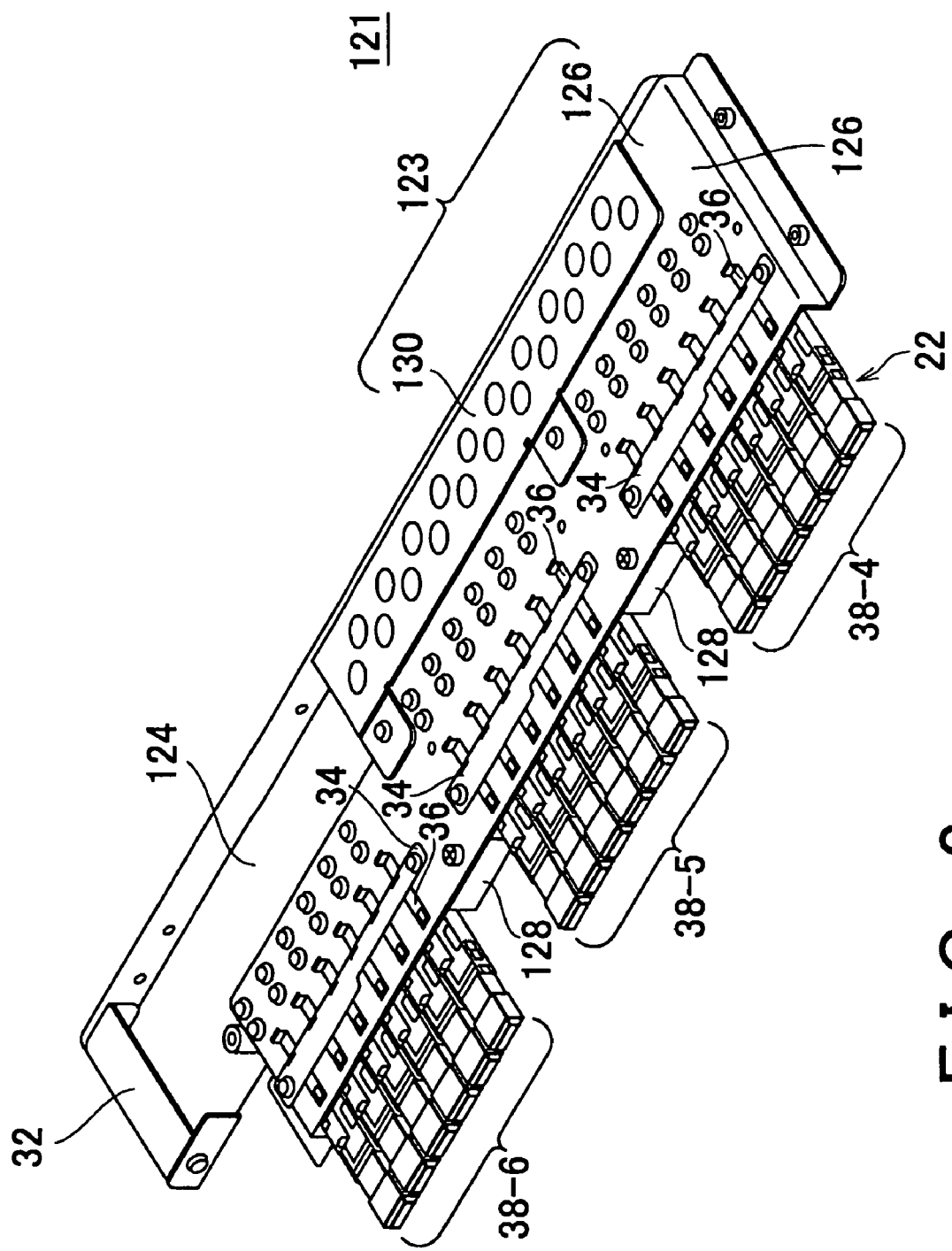
FIG. 8 is a diagram which shows an example of the configuration of a connector holder 121 of a second cable unit 120.

FIG. 8 is a diagram which shows an example of the configuration of a connector holder 121 of the second cable unit 120. The connector holder 121 includes an upper-side base 123 and a lower-side base 124. Note that the terms "upper-side" and "lower-side" are used only for distinction of these bases. They are not intended to indicate the position relation therebetween in actual usage. Note that the optical fiber cables 40 are not shown in the present drawing.

The upper-side base 123 has a structure approximately symmetrical with respect to the structure of the upper-side base 23 of the first cable unit 20 in the left and right directions. The upper-side base 123 includes an upper-side main base 126 and an upper-side sub-base 130. The upper-side main base 126 and the upper-side sub-base 130 have structures approximately symmetrical with respect to the structures of the upper-side main base 26 and the upper-side sub-base 30 of the first cable unit 20 in the left and right directions, respectively. Note that the second cable unit 120 has no unit fixing portion 28. Accordingly, the upper-side base 126 has no screw opening 52 corresponding to the unit fixing portion 28. The lower-side base 124 has a structure approximately symmetrical with respect to the structure of the lower-side base 24 of the first cable unit 20 in the left and right directions. Detailed description will be made later regarding the structure of the lower-side base 124 with reference to FIG. 9.

Figure 9:
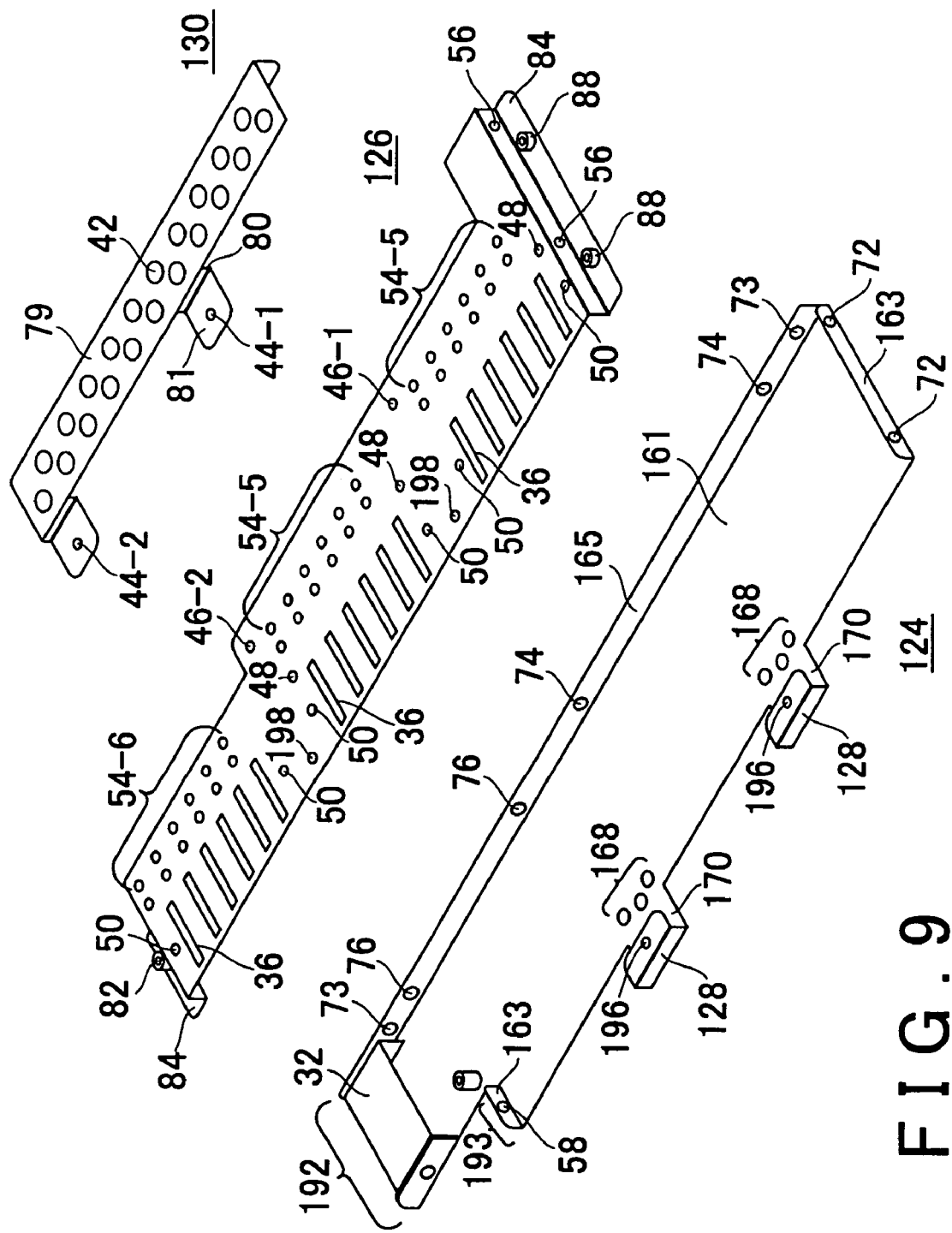
FIG. 9 is a diagram which shows an example of the exterior of an upper-side main base 126, an upper-side sub-base 130, and a lower-side base 124.

FIG. 9 is a diagram which shows an example of the exterior of the upper-side main base 126, the upper-side sub-base 130, and the lower-side base 124.

In FIG. 9, the components denoted by the same reference numerals shown in FIG. 4 have the same functions and the same structures of those shown in FIG. 4. The upper-side main base 126 and the upper-side sub-base 130 have the structures approximately symmetrical with respect to the structures of the upper-side main base 26 and the upper-side sub-base 30 of the first cable unit 20 in the left and right directions as described above with reference to FIG. 8. Furthermore, the upper-side main base 126 includes screw openings 198 for fixing the upper-side main base 126 to the lower-side base 124 with screws, instead of the screw openings 52.

The lower-side base 124 includes a bottom face 161 approximately parallel with the front face of the upper-side main base 126, two side faces 163, which extend from the bottom face 161 toward the upper-side main base 126 and are approximately parallel with the connection direction, a cable passage-portion side face 165 which extends from the bottom face 161 toward the upper-side main base 126 and which has the normal vector in the connection direction. Note that no side face is provided on the side of the bottom face 161 where the unit-side connectors 122 are to be arranged. Furthermore, the bottom face 61 has protruding faces 170 protruding in the connection direction from the side thereof where the unit-side connectors 22 are to be arranged.

The bottom face 161 has a connector region 193 where the unit-side connectors 22 are to be inserted and arranged, and a cable passage region 192 where the optical-fiber cables 40 connected to the corresponding unit-side connectors 22 pass therethrough. The cable passage region 192 of the lower-side base 124 has a shape approximately symmetrical with respect to the cable passage region 92 of the lower-side base 24 in the left and right directions. The connector region 193 includes the protruding faces 170. Each protruding face 170 has a folded front face 128 extending toward the upper-side main base 126. The folded front face 128 includes a screw opening 196. The screw opening 196 is fastened to the screw opening 198 formed on the upper-side main base 126.

Figure 10:
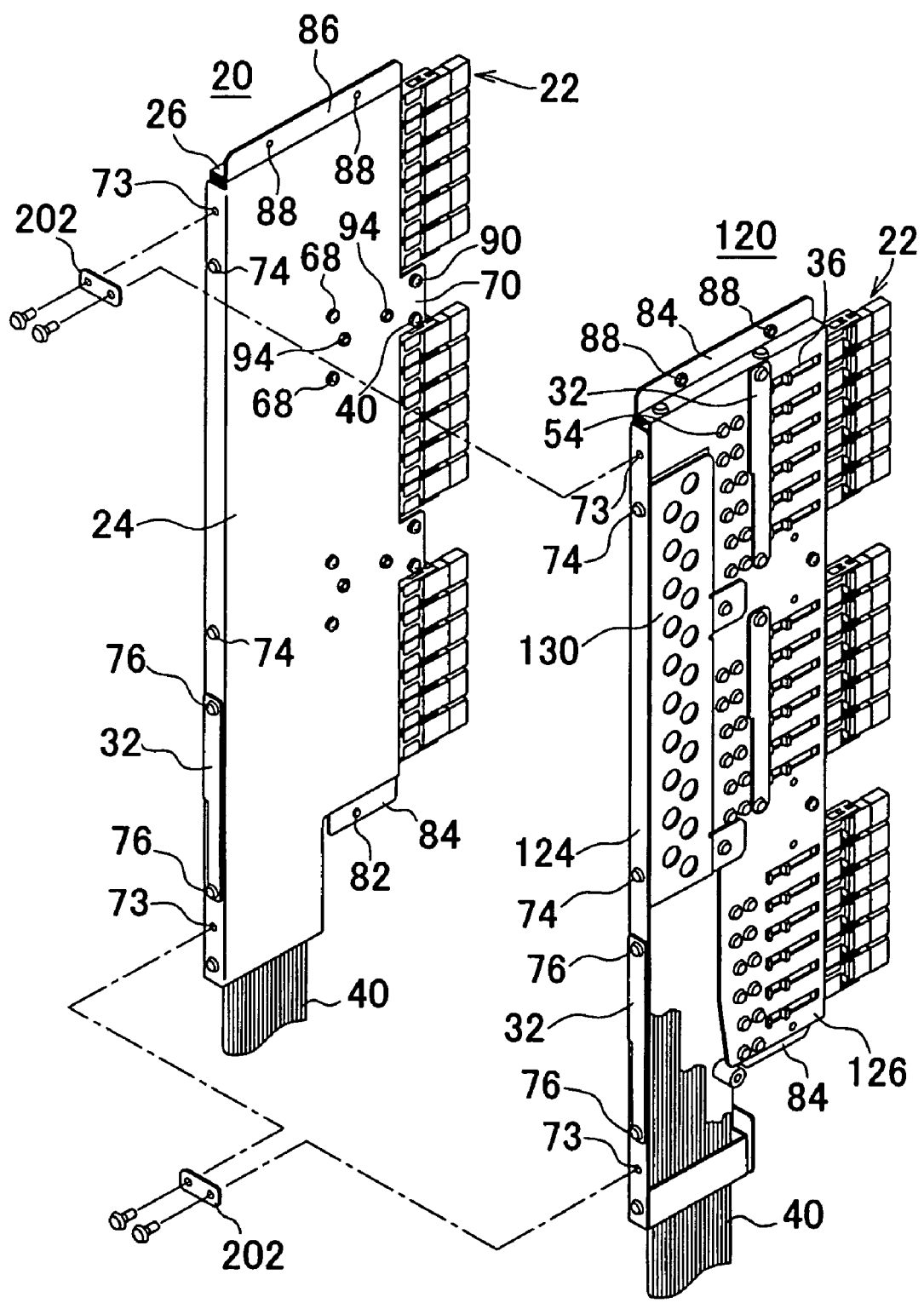
FIG. 10 is a schematic diagram which shows an assembly in which the first cable unit 20 and the second cable unit 120 are layered.

On the other hand, the connector region 193 has a smaller width in the connection direction than the width of the connector region 93 of the first cable unit 20 in the connection direction. As shown in FIG. 10, the second cable unit 120 and the first cable unit 20 are layered with the rear faces of the bottom faces 161 and 61 being in contact with each other. With such an arrangement, the unit-side connectors 22 of the second cable unit 120 are held by the lower-side base 24 of the first cable unit 20 and the upper-side main base 126 of the second cable unit 120. Furthermore, the lower-side base 124 includes through holes 168 at positions corresponding to the screw openings (68, 94) provided to the lower-side base 24 of the first cable unit 20. Such a structure allows the tip of the screw inserted into each of the screw openings (68, 94) to be inserted into the corresponding through hole 168 after the first cable unit 20 and the second cable unit 120 have been layered. This prevents tilting of the lower-side base 124 due to these screws coming in contact with the rear face of the lower-side base 124. This enables the first cable unit 20 and the second cable unit 120 to be fixed in close contact with each other.

FIG. 10 is a schematic diagram which shows an assembly in which the first cable unit 20 and the second cable unit 120 are layered. As described above, the first cable unit 20 and the second cable unit 120 are layered with the rear faces of the lower-side base 24 and the lower-side base 124 being in contact with each other. Then, the corresponding screw openings (82, 88) are fastened to each other, and the corresponding screw openings 73 are fastened using a connection member 202. Thus, the second cable unit 120 is fixed to the first cable unit 20. The first cable unit 20 is fixed to the test board 14. Thus, the second cable unit 120 is also fixed at a predetermined position on the test board 14.

The test board 14 outputs control signals in the form of laser light. When the first cable unit 20 and the second cable unit 120 are connected to the test board 14, the laser light emitted from each frame-side connector 16 of the test board 14 is shielded by the cable passage-portion side face 65 of the first cable unit 20 and the cable passage-portion side face 165 of the second cable unit 120.

With such an arrangement, there is a need to remind the user of the danger due to the laser light. The present embodiment may include a warning plate which calls the user's attention. Furthermore, there is a need to use a special jig for removing each unit-side connector 22 from the frame-side connector 16 as described later. This also calls the user's attention.

Next, description will be made regarding an arrangement in which multiple cable units are connected to multiple test boards 14 in order, provided to the main frame in parallel. First, of the test boards 14 provided in parallel, the first cable unit 20 is fixed to the leftmost test board 14. Then, each unit-side connector 22 is inserted to the corresponding frame-side connector 16 provided on the front face of the test board 14. Then, the second cable unit 120 is fixed to the first cable unit 20. Subsequently, each unit-side connector 22 is inserted to the corresponding frame-side connector 16 provided on the rear face of the test board 14.

Then, the next first cable unit 20 is fixed to the next test board 14. Then, each unit-side connector 22 is inserted into the corresponding frame-side connector 16 provided on the front face of this test board 14. In this step, in some cases, it is difficult for the user to handle the handle portion 112 as it protrudes toward the second cable unit 120 previously fixed. In such a case, the user preferably uses a jig for moving the unit-side connector 22. The aforementioned jig includes means for fitting to the face of the unit-side connector 22 which is the rear face of the face where the handle portion 112 is provided.

Thus, the user can move each unit-side connector 22 using the aforementioned jig from the rear face of the user-side connector 22.

Such steps are repeatedly performed, whereby the cable units (20, 120) are fixed to each of all the test boards 14, and each of all the unit-side connectors 22 is inserted into the corresponding frame-side connector 16.

Figure 11:
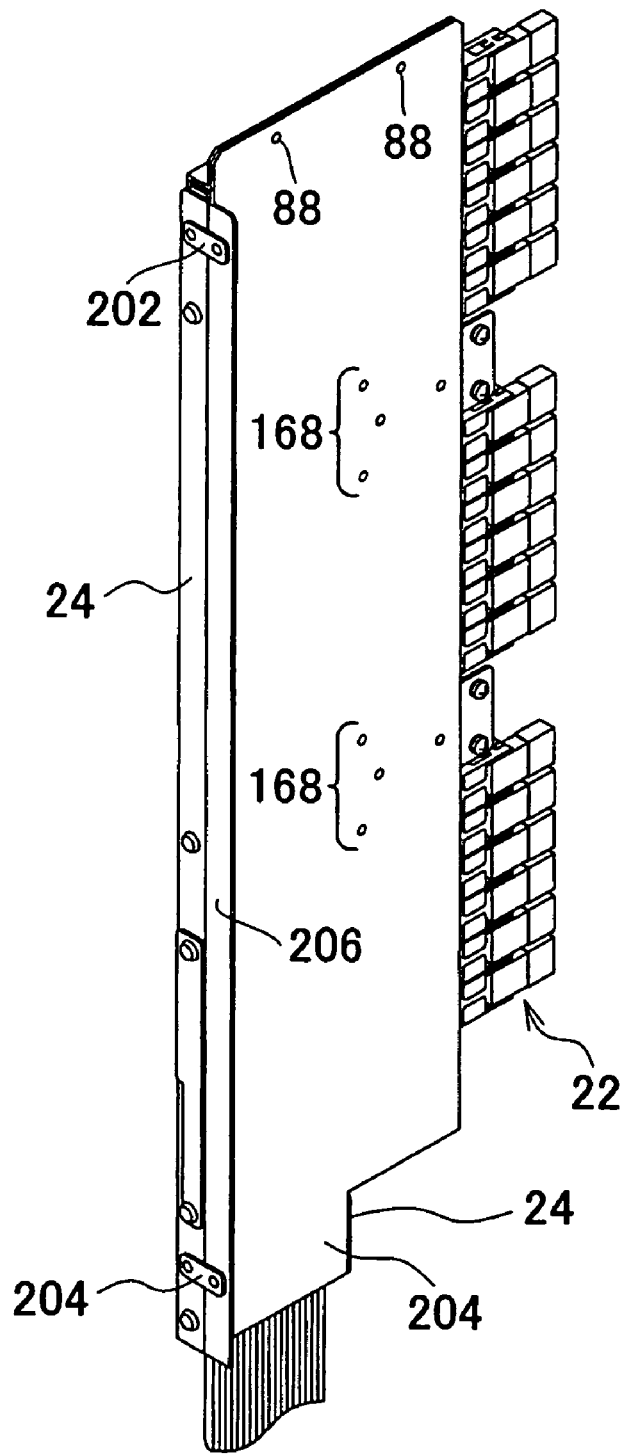
FIG. 11 is a diagram which shows an example of the structure of the first cable unit 20 to be fixed to the test board 14 in a case in which the frame-side connectors 16 provided to the rear face of the test board 14 are not used.

FIG. 11 is a diagram which shows an example of the structure of the first cable unit 20 to be fixed to the test board 14 in a case in which the frame-side connectors 16 provided to the rear face of the test board 14 are not used. With the test apparatus 100 according to the present example, the electronic device 300 is tested using the single test head 12 alone. In this case, the first cable unit 20 further includes a shield plate 204 in addition to the configuration of the first cable unit 20 described above with reference to FIG. 10. The shield plate 204 is fixed to the first cable unit 20 in the same way as with the second cable unit 120 described above with reference to FIG. 10. The shield plate 204 has a side face 206 at a position for shielding the path of the laser light emitted from each frame-side connector 16 provided on the rear face of the test board 14. For example, the shield plate 204 has the side face 206 at the same position as with the cable passage-portion side face 165 of the lower-side base 124 of the second test board 120. Such an arrangement protects the user from the laser light emitted from each frame-side connector 16 provided on the rear face of the test board 14.

While the present invention has been described above by way of embodiments, the technical scope of the present invention is not restricted to the description of the embodiments above. Various modifications and improvements can be made to the above embodiments, which can be clearly understood by those skilled in this art. It is clearly understood from the Claims that arrangements obtained by such modifications or improvements are also within the technical scope of the present invention.

As can be clearly understood from the above description, the present invention provides efficient and safe connection of a great number of connectors of optical fiber cables.

What is claimed is:

1. A test apparatus which tests an electronic device comprising:
   a test head which applies a test pattern to said electronic device;
   a main frame which includes a plurality of frame-side connectors and which supplies control signals to said test head via said frame-side connectors;
   a cable unit which provides optical connection between said frame-side connectors and said test head, and which transmits said control signals to said test head, wherein said cable unit comprises:
      a plurality of optical fiber cables which transmit said control signals,
      a plurality of unit-side connectors which are provided at the ends of said optical fiber cables, and which are provided corresponding to said plurality of frame-side connectors,
      a unit fixing portion which fixes said cable unit to said main frame, and
      a connector holder which holds said unit-side connectors in a manner which enables each unit-side connector to be inserted/extracted into/from said frame-side connector independent of each other, wherein said connector holder includes a retaining portion which enables each of said unit-side connectors to be retained even if each of said unit-side connectors is not connected to said frame-side connector; and
   said test apparatus wherein said plurality of unit-side connectors are provided on the face of said cable unit, in parallel with the connector-array direction which is approximately perpendicular to the connection direction of said frame-side connectors, and
   wherein each of said unit-side connectors includes a retaining tab protruding in the unit-layered direction which is approximately perpendicular to both said connection direction and said connector-array direction, and
   wherein said connector holder further comprises a holder base which has through grooves to which said retaining tabs of said corresponding unit-side connectors are to be inserted, and which holds the unit-side connectors in a manner which enables said unit-side connectors to be moved in said connection direction by holding said retaining tabs movably in said connection direction with each retaining tab being inserted into said corresponding through grooves.

2. A test apparatus according to claim 1, wherein said connector holder holds each of said unit-side connectors in a manner which allows movement of said unit-side connectors in the connection direction independent of each other.

3. A test apparatus according to claim 1, wherein said plurality of frame-side connectors are provided to a test board inserted into said main frame, and wherein said retaining portion retains said plurality of unit-side connectors at positions so as to not come in contact with said test board after said unit fixing portion has fixed said cable unit.

4. A test apparatus according to claim 1, wherein said plurality of through grooves are formed at approximately the same pitch as the width of said unit-side connector in said connector-array direction.

5. A test apparatus according to claim 1, wherein said retaining tab includes a rear-side tab and a front-side tab provided at a position closer to said test board than said rear-side tab,
   wherein said retaining portion comprises a retaining plate which is detachably provided to said holder base, and which is fit to said front-side tabs of said plurality of unit-side connectors, and
   wherein said rear-side tab of each of said unit-side connectors is fit to the rear end of said through groove, and said front-side tab of each of said unit-side connectors is fit to said retaining plate, thereby retaining said plurality of unit-side connectors at positions so as to not come in contact with said test head.

6. A test apparatus according to claim 5, wherein said retaining portion includes means for detachably fixing said retaining plate at a position where said retaining plate is fit to said front-side tab of each of said unit-side connectors in a case in which said rear-side tab of each of said unit-side connectors is fit to the rear end of said through groove.

7. A test apparatus according to claim 6, wherein said retaining portion further includes means for detachably fixing said retaining plate at a position where said retaining plate is fit to said rear-side tab of each of said unit-side connectors in a case in which said front-side tab of each of said unit-side connectors is fit to the front end of said through groove.

8. A test apparatus according to claim 7, wherein said retaining portion further includes means for detachably fixing said retaining plate at a position where said retaining plate comes in contact with neither said front-side tab nor said rear-side tab.

9. A test apparatus according to claim 5, wherein each of said unit-side connectors further includes a return prevention protrusion which has elasticity, and which protrudes in said unit-layered direction, and which is provided at a position where said return prevention protrusion comes in contact with the front end of the through groove in a case in which said rear-side tab is fit to said rear end of said through groove.

10. A test apparatus according to claim 5, wherein each of said unit-side connectors further includes a handle portion which protrudes in said unit-layered direction, and which is provided at a position where said handle portion is exposed outside of said holder base in a case in which said rear-side tab is fit to said rear end of said through groove.

11. A test apparatus according to claim 5, wherein said cable unit includes a plurality of connector blocks each of which has a plurality of said unit-side connectors, and wherein said retaining portion includes said retaining plate and means for detachably fixing said retaining plate for each connector block.

12. A test apparatus according to claim 11, wherein said holder base includes openings each of which is provided between said adjacent connector blocks, and
wherein said test board includes extending portions provided at positions corresponding to said openings, and
wherein said fixing portion fixes said holder base and said extending portions with each of said extending portions being inserted into said corresponding opening.

13. A test apparatus according to claim 1, wherein said holder base comprises:
an upper-side base which has a front face with said unit-layered direction as the direction of the normal vector thereof, and which includes said through grooves provided on said front face; and
a lower-side base which has a front face with said unit-layered direction as the direction of the normal vector thereof, and which is provided at a predetermined interval with respect to said upper-side base,
wherein said plurality of unit-side connectors are inserted between said upper-side base and said lower-side base.

14. A test apparatus according to claim 13, wherein said lower-side base comprises:
a cable passage portion where each of said optical fiber cables passes through; and
a cable outlet which is provided at the end of said cable passage portion, and which has an opening for inserting said optical fiber cables extending outside of said connector holder,
wherein the front face of said upper-side base where said through grooves are provided includes a plurality of through holes in a region facing said cable passage portion.

15. A test apparatus according to claim 14, wherein said cable unit includes a plurality of connector blocks each of which has a plurality of said unit-side connectors, and wherein the front face of said upper-side base facing said cable passage portion where said optical fiber cables connected to said connector block positioned closest to said cable outlet pass there through is notched.

16. A test apparatus according to claim 14, wherein the interval between said upper-side base and said lower-side base in the region corresponding to said cable passage portion is greater than the interval of said upper-side base and said lower-side base in the region corresponding to said through grooves.

17. A test apparatus according to claim 14, wherein said cable passage portion includes a side face extending from the front face with said unit-layered direction of said lower-side base as the direction of the normal vector thereof, toward said upper-side base, and wherein said retaining portion includes means for detachably fixing said retaining plate to said side face.

18. A test apparatus according to claim 14, wherein said upper-side base comprises:
an upper-side main base including said plurality of through grooves; and
an upper-side sub-base which includes said plurality of through holes, and which is detachably fixed to said upper-side main base in the region facing said cable passage portion.

19. A test apparatus which tests an electronic device comprising:
a first test head and a second test head each of which applies a test pattern to said electronic device;
a main frame which includes a test board on the front face and the rear face thereof, each of which includes a plurality of frame-side connectors, with control signals being supplied to said first test head via said frame-side connectors provided on said front face, and with control signals being supplied to said second test head via said frame-side connectors provided on said rear face;
a first cable unit which provides optical connection between said frame-side connectors provided to said front face of said test board and said first test head, and which transmits said control signals to said first test head;
a second cable unit which provides optical connection between said frame-side connectors provided to said rear face of said test board and said second test head, and which transmits said control signals to said second test head,
wherein each of said first cable unit and said second cable unit comprises a plurality of optical fiber cables which transmit said control signals, a plurality of unit-side connectors each of which is provided to the end of said optical fiber cable, and which are provided corresponding to said plurality of frame-side connectors, and a connector holder which holds said unit-side connectors in a manner which enables each of said unit-side connectors to be inserted/extracted into/from the corresponding one of said frame-side connectors independent of each other,
and wherein said first cable unit further includes a first unit fixing portion which fixes said cable unit to said test board,
and wherein said second cable unit further includes a second unit fixing portion which fixes said second cable unit to said first cable unit;
wherein said connector holder includes a retaining portion which enables each of said unit-side connectors to be retained even if each of said unit-side connectors is not connected to said frame-side connector; and
said test apparatus wherein said plurality of unit-side connectors are provided on the face of said cable unit, in parallel with the connector-array direction which is approximately perpendicular to the connection direction of said frame-side connectors, and
wherein each of said unit-side connectors includes a retaining tab protruding in the unit-layered direction which is approximately perpendicular to both said connection direction and said connector-array direction, and
wherein said connector holder further comprises a holder base which has through grooves to which said retaining tabs of said corresponding unit-side connectors are to be inserted, and which holds the unit-side connectors in a manner which enables said unit-side connectors to be moved in said connection direction by holding said retaining tabs movably in said connection direction with each retaining tab being inserted into said corresponding through grooves.

* * * * *